United States Patent
Schuster

(10) Patent No.: US 6,954,316 B2
(45) Date of Patent: Oct. 11, 2005

(54) PROJECTION OBJECTIVE

(75) Inventor: Karl-Heinz Schuster, Königsbronn (DE)

(73) Assignee: Carl Zeiss SMT, Oberkochen (DE)

( * ) Notice: Subject to any disclaimer, the term of this patent is extended or adjusted under 35 U.S.C. 154(b) by 0 days.

(21) Appl. No.: 10/094,565

(22) Filed: Mar. 8, 2002

(65) Prior Publication Data

US 2003/0048547 A1 Mar. 13, 2003

Related U.S. Application Data

(63) Continuation of application No. PCT/EP01/14846, filed on Dec. 15, 2001.

(30) Foreign Application Priority Data

Dec. 22, 2000 (DE) .......................................... 100 65 944
Jun. 1, 2001 (DE) .......................................... 101 26 946

(51) Int. Cl.[7] .............................. G02B 9/04; G02B 9/62
(52) U.S. Cl. ......................... 359/793; 359/757; 359/763
(58) Field of Search ................................ 359/649–651, 359/688, 663, 679, 754, 755, 757, 758, 759, 761, 762, 763–770

(56) References Cited

U.S. PATENT DOCUMENTS

| | | | |
|---|---|---|---|
| 5,164,750 A | 11/1992 | Adachi ........................ 351/212 |
| 5,353,156 A | * 10/1994 | Chung ......................... 359/649 |
| 5,831,770 A | * 11/1998 | Matsuzawa et al. ........ 359/649 |
| 5,831,776 A | * 11/1998 | Sasaya et al. ............... 359/754 |
| 5,969,803 A | 10/1999 | Mercado ....................... 355/67 |
| 5,986,824 A | 11/1999 | Mercado ..................... 359/754 |
| 5,990,926 A | 11/1999 | Mercado ..................... 347/258 |
| 6,018,424 A | 1/2000 | Morgan ....................... 359/708 |
| 6,075,650 A | 6/2000 | Morris ......................... 359/641 |
| 6,084,723 A | 7/2000 | Matsuzawa et al. ........ 359/754 |
| 6,088,171 A | 7/2000 | Kudo .......................... 359/754 |
| 6,104,544 A | * 8/2000 | Matsuzawa et al. ........ 359/649 |
| 6,549,266 B1 | * 4/2003 | Taniguchi ..................... 355/53 |
| 6,646,718 B2 | 11/2003 | Schuster ....................... 355/67 |
| RE38,403 E | * 1/2004 | Sasaya et al. ............... 359/649 |
| 6,831,794 B2 | 12/2004 | Schuster ..................... 359/708 |

FOREIGN PATENT DOCUMENTS

| | | | |
|---|---|---|---|
| DE | 198 18 444 A1 | 4/1998 | .......... G02B/13/18 |
| DE | 198 18 444 | 10/1998 | .......... G02B/13/18 |
| DE | 100 54 256.5 | 2/2000 | |
| DE | 199 42 281 A1 | 11/2000 | .......... G02B/13/18 |
| DE | 101 52 528 A1 | 10/2001 | ............. G13F/7/20 |
| EP | 0 332 201 | 9/1989 | .......... G02B/13/00 |
| EP | 0 712 019 A2 | 10/1995 | .......... G02B/13/24 |
| EP | 0 721 150 A2 | 7/1996 | ............. G03F/7/20 |
| WO | WO 00 70407 A | 11/2000 | ............. G03F/7/20 |

OTHER PUBLICATIONS

U.S. Appl. No. 09/760,066, filed Jan. 12, 2001, Schuster.

* cited by examiner

Primary Examiner—Timothy Thompson

(57) ABSTRACT

Projection exposure device and also projection objective with a lens arrangement which has at least one lens group of negative refractive power, this lens group comprising at least four lenses of negative refractive power, and a lens of positive refractive power being arranged after the third lens of negative refractive power in this lens group.

20 Claims, 5 Drawing Sheets

PROJECTION OBJECTIVE

CROSS-REFERENCES TO RELATED APPLICATIONS

This application is a continuation application of PCT/EP01/14846, file date Dec. 15, 2001 which is pending.

STATEMENT REGARDING FEDERALLY SPONSORED RESEARCH OR DEVELOPMENT

Not applicable.

BACKGROUND OF THE INVENTION

The invention relates to a projection objective having at least one lens group of negative refractive power, this lens group including at least four lenses of negative refractive power.

TECHNICAL FIELD

From German Patent Document DE 199 42 281.8, FIGS. 8–10, a projection objective is known whose first lens group with negative refractive power consists of four negative lenses. Projection objectives are likewise known from European Patent Document EP 712 019 A2, U.S. Pat. No. 5,969,803, U.S. Pat. No. 5,986,824 and DE 198 18 444 A1 with a first lens group of negative refractive power, consisting of at least four negative lenses.

A projection objective is known from U.S. Pat. No. 5,990,926 and has a first lens group of negative refracting power, consisting of three negative lenses. Projection objectives are known from the documents U.S. Pat. No. 6,084,723, EP 721 150 A2, U.S. Pat. No. 6,088,171, and DE 198 18 444 A1, and have a lens group of negative refractive power, which forms a first waist and which consists of four negative lenses, a lens of positive refractive power being arranged after the first negative lens.

From DE 199 42 281, FIGS. 2–4, a lens group of negative refractive power is known which consists of four negative lenses, a positive lens being arranged after the second negative lens. A meniscus lens curved toward the image is provided as the positive lens.

SUMMARY OF THE INVENTION

The invention has as its object to develop a lens group of negative refractive power which has an advantageous effect on the imaging properties of a projection objective.

The object of the invention is attained by a lens of positive refractive power arranged in this lens group after a third lens of negative refractive power.

A further object of the invention is to improve the imaging properties of a projection objective, particularly for an illumination wavelength of 193 nm, with little use of calcium fluoride.

The imaging properties of the objective could be improved by the measure of constructing a lens group of negative refractive power such that this lens group of negative refractive power consists of four lenses of negative refractive power, a lens of positive refractive power being arranged after the third lens of negative refractive power. This configuration with the lens of positive refractive power has advantageous effects on astigmatism and coma correction.

It has also been found to be advantageous to provide a meniscus lens as the positive lens. This additionally makes possible a favorable effect on the sagittal coma.

It has furthermore been found to be advantageous that the lens of positive refractive power is provided with a convex lens surface on the object side.

Further advantageous measures are described in the claims.

BRIEF DESCRIPTION OF THE DRAWINGS

The invention is described in detail using a few embodiment examples.

DETAILED DESCRIPTION OF THE INVENTION

Figure 1:
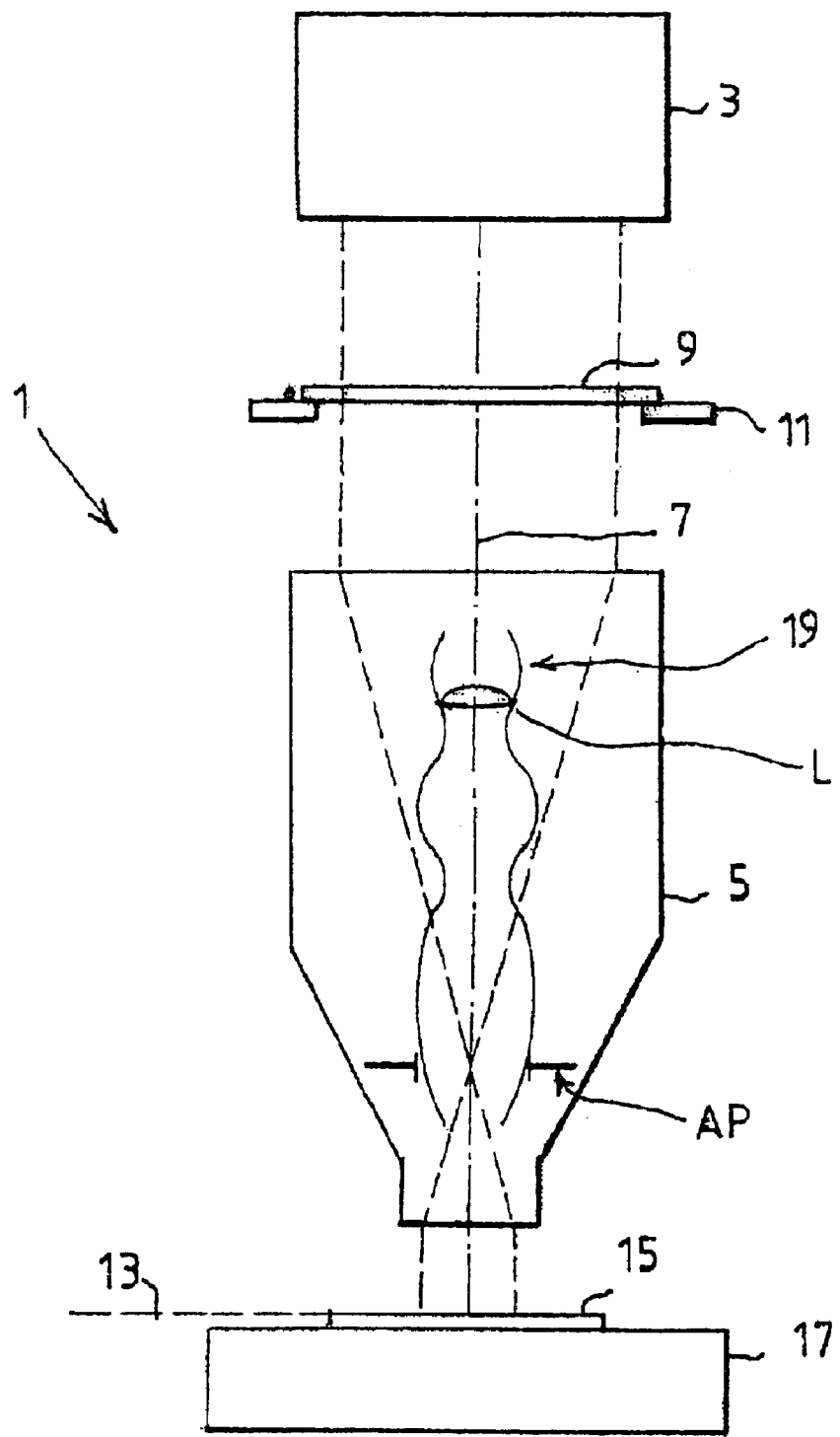
FIG. 1 shows a projection exposure device.

The construction of a projection exposure device is first described in principle using FIG. 1. The projection exposure device 1 has an illumination device 3 and a projection objective 5. The projection objective comprises a lens arrangement 19 with an aperture diaphragm AP, an optical axis 7 being defined by the lens arrangement 19. A mask 9 is arranged between the illumination device 3 and the projection objective 5, and is held in the beam path by means of a mask holder 11. Such masks used in microlithography have a micrometer or nanometer structure. This structure of the mask is imaged on an image plane 13, reduced by means of the projection objective 5 by up to a factor of ten, in particular by the factor four. A substrate or a wafer 15, positioned by a substrate holder 17, is held in the image plane 13. The minimum structures which can still be resolved depend on the wavelength $\lambda$ of the light used for illumination and also on the image-side aperture of the projection objective 5; the maximum attainable resolution of the projection exposure device 1 increases with decreasing wavelength of the illumination device 3 and with increasing aperture of the projection objective 5.

Figure 2:
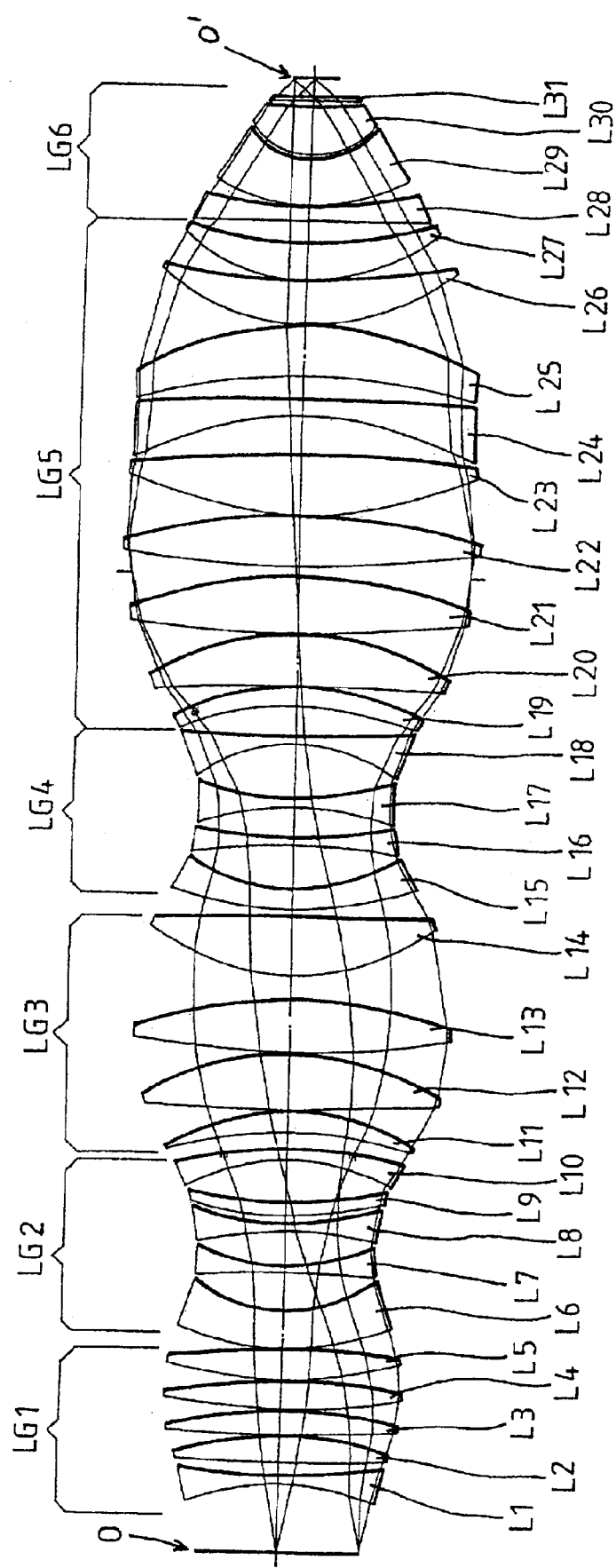
FIG. 2 shows a lithographic objective, particularly for 193 nm.
Figure 5:
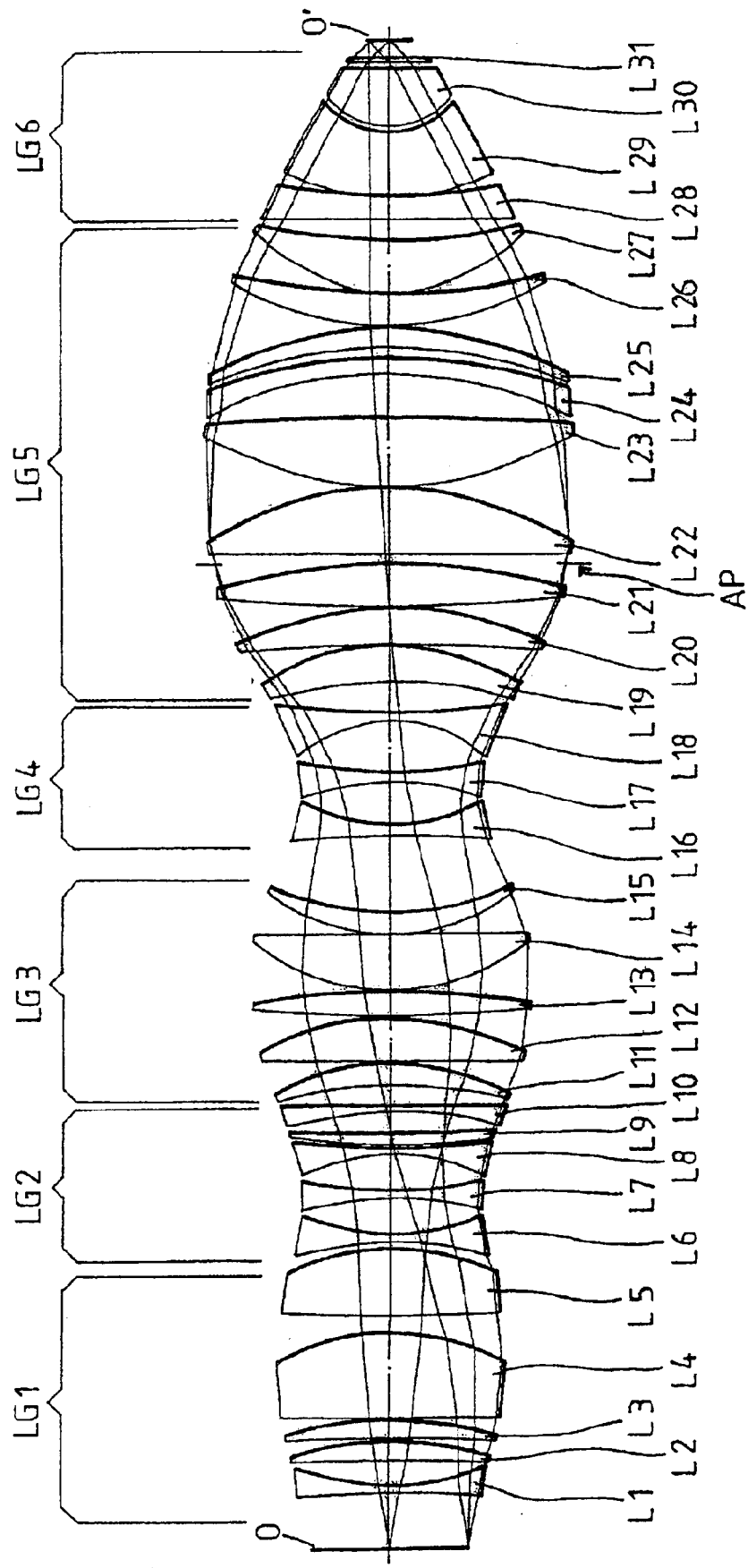
FIG. 5 shows a lithographic objective, particularly for an illumination wavelength of 351 nm.

Different embodiments of lens arrangements 19 are shown in FIGS. 2 and 5.

FIG. 2 shows a lens arrangement 19 which is designed for an illumination wavelength of 193 nm and an image-side aperture of 0.75. In this lens arrangement, the distance between the projection plane 0 and image plane 0' is 1,000 mm. The projection objective shown comprises 31 lenses L1–L31, which can be divided into six lens groups LG1–LG6.

A first lens group LG1 has positive refractive power, and consists of the lenses L1–L5. The adjoining lens group LG2 has overall negative refractive power. The first lens L6 of this lens group is a thick meniscus lens, the middle thickness of which in the region of the optical axis is at least 15% of the maximum lens diameter. This lens has a particularly advantageous effect on the flattening of the image surface in the tangential and sagittal directions.

This lens L6 is followed by two further lenses of negative refractive power. In this embodiment example, two biconcave lenses are provided for these lenses L7 and L8. The adjoining lens L9 has positive refractive power. This lens L9 is a meniscus lens, curved toward the image, with a concave radius of curvature on the image side. An advantageous effect is obtained with this lens with respect to astigmatism, coma, and sagittal coma. The following lens L10 has negative refractive power and is a meniscus lens curved toward the image. This lens L10 is provided with an aspheric surface on the image side. In particular, image errors in the region between the image field zone and the image field margin can be corrected by means of this aspheric. This correction effects an increase of the image quality, particularly in the sagittal direction. A waist is formed by this second lens group LG2 having negative refractive power.

The adjoining third lens group LG3 has positive refractive power and consists of the lenses L11–L14. A fourth lens group LG4 follows this third lens group LG3 and has negative refractive power, and a second waist is formed by it. This fourth lens group LG4 comprises the lenses L15–L18, the lens L15 being a meniscus lens curved toward the image, with a concave surface curvature on the image side.

The fifth lens group LG5 comprises the lenses L19–L27 and has positive refractive power overall. A diaphragm is arranged between the positive lenses L21 and L22. The maximum diameter of this lens group or of the projection objective is about 240 mm. The sixth lens group LG6 likewise has positive refractive power, and comprises the lenses L28–L31, the lens L31 being a plane parallel plate. The lens L30, which is heavily stressed by radiation, consists of calcium fluoride to reduce compaction. Quartz glass is provided as the lens material for the remaining lenses. The use of quartz glass as the lens material has the advantage that this material, in comparison with calcium fluoride, is in the first place available on the market, and also is a less expensive material in comparison with fluoride crystals such as e.g. calcium fluoride and barium fluoride, to name only a few here.

With an image field of 28.04 mm, the longitudinal color error for the bandwidth of 0.25 pm (thus ±0.125 pm) is a maximum of 57.5 nm. The transverse color error reaches no greater value than 1.2 nm for $\Delta\lambda\pm0.125$ pm. The RMS value is an established measure, e.g., established in CODE V, of how strongly the wavefront deviates from the wavefront of an ideal spherical wave. In this embodiment example, the RMS value is smaller than 7.0 m$\lambda$ for all image points. The numerical aperture of this projection objective is 0.75.

The exact lens data are given in Table 1.

TABLE 1

| | 193.304 nm m1301b | | | | Refractive indices | |
| --- | --- | --- | --- | --- | --- | --- |
| Lens Surface | Radii | Thicknesses | Glasses | Hmax | 193.304 nm | 193.804 nm |
| 1 | Infinity | 14.6448 | L710 | 62.030 | .999982 | .999982 |
| 2 | −166.55059 | 7.0000 | SIO2 | 62.490 | 1.560289 | 1.559505 |
| 3 | 506.05751 | 7.6109 | HE | 68.747 | .999712 | .999712 |
| 4 | 2154.09731 | 17.8345 | SIO2 | 71.001 | 1.560289 | 1.559505 |
| 5 | −236.44399 | .7000 | HE | 72.626 | .999712 | .999712 |
| 6 | 1300.07069 | 17.5997 | SIO2 | 76.997 | 1.560289 | 1.559505 |
| 7 | −300.86909 | .7000 | HE | 77.840 | .999712 | .999712 |
| 8 | 485.10529 | 18.6566 | SIO2 | 79.774 | 1.560289 | 1.559505 |
| 9 | −465.03408 | .7000 | HE | 79.824 | .999712 | .999712 |
| 10 | 269.93230 | 21.2497 | SIO2 | 78.221 | 1.560289 | 1.559505 |
| 11 | −759.19722 | .7000 | HE | 77.300 | .999712 | .999712 |
| 12 | 210.59503 | 26.0777 | SIO2 | 71.714 | 1.560289 | 1.559505 |
| 13 | 100.59316 | 23.6901 | HE | 60.361 | .999712 | .999712 |
| 14 | −1723.36549 | 6.3000 | SIO2 | 60.021 | 1.560289 | 1.559505 |
| 15 | 134.93156 | 23.1342 | HE | 58.507 | .999712 | .999712 |
| 16 | −253.77701 | 6.3000 | SIO2 | 58.968 | 1.560289 | 1.559505 |
| 17 | 207.65329 | 3.7881 | HE | 63.355 | .999712 | .999712 |
| 18 | 248.43656 | 10.0000 | SIO2 | 64.814 | 1.560289 | 1.559505 |
| 19 | 289.02332 | 27.2836 | HE | 66.785 | .999712 | .999712 |
| 20 | −149.66622 | 8.0000 | SIO2 | 68.386 | 1.560289 | 1.559505 |
| 21 | −343.08973A | 12.2670 | HE | 76.791 | .999712 | .999712 |
| 22 | −261.71401 | 14.0893 | SIO2 | 82.489 | 1.560289 | 1.559505 |
| 23 | −158.93251 | .7056 | HE | 84.325 | .999712 | .999712 |
| 24 | 2089.67024 | 36.8436 | SIO2 | 99.088 | 1.560289 | 1.559505 |
| 25 | −197.66453 | .7000 | HE | 101.087 | .999712 | .999712 |
| 26 | 656.07716 | 36.9267 | SIO2 | 106.566 | 1.560289 | 1.559505 |
| 27 | −310.68503 | 15.0566 | HE | 106.873 | .999712 | .999712 |
| 28 | 163.06222 | 40.6761 | SIO2 | 96.385 | 1.560289 | 1.559505 |
| 29 | −4111.47456 | 3.5361 | HE | 93.567 | .999712 | .999712 |
| 30 | 250.51145 | 15.0000 | SIO2 | 82.093 | 1.560289 | 1.559505 |
| 31 | 127.80623 | 29.9608 | HE | 70.545 | .999712 | .999712 |
| 32 | −395.01305 | 6.3000 | SIO2 | 69.409 | 1.560289 | 1.559505 |
| 33 | 365.10790 | 20.3664 | HE | 65.891 | .999712 | .999712 |
| 34 | −193.49584 | 6.3000 | SIO2 | 65.302 | 1.560289 | 1.559505 |
| 35 | 181.51555 | 36.3017 | HE | 65.615 | .999712 | .999712 |
| 36 | −117.90431 | 6.3037 | SIO2 | 66.498 | 1.560289 | 1.559505 |
| 37 | 1509.29994 | 19.7322 | HE | 77.925 | .999712 | .999712 |
| 38 | −217.57963 | 13.5438 | SIO2 | 79.866 | 1.560289 | 1.559505 |
| 39 | −187.32781 | .7000 | HE | 85.009 | .999712 | .999712 |
| 40 | −1458.10055 | 33.4944 | SIO2 | 97.198 | 1.560289 | 1.559505 |
| 41 | −205.38045 | .7000 | HE | 101.387 | .999712 | .999712 |
| 42 | 975.11627 | 38.4016 | SIO2 | 113.083 | 1.560289 | 1.559505 |
| 43 | −328.97948 | −.1900 | HE | 114.925 | .999712 | .999712 |
| 44 | Infinity | 7.0480 | HE | 116.031 | .999712 | .999712 |
| | Diaphragm | .0000 | | 116.031 | | |

TABLE 1-continued

| | 193.304 nm m1301b | | | | Refractive indices | |
|---|---|---|---|---|---|---|
| Lens Surface | Radii | Thicknesses | Glasses | Hmax | 193.304 nm | 193.804 nm |
| 45 | 862.15240 | 33.9785 | SIO2 | 119.182 | 1.560289 | 1.559505 |
| 46 | −429.49378 | .7000 | HE | 119.854 | .999712 | .999712 |
| 47 | 290.91831 | 39.9124 | SIO2 | 118.102 | 1.560289 | 1.559505 |
| 48 | −1135.09587 | 25.2506 | HE | 116.490 | .999712 | .999712 |
| 49 | −250.90293 | 12.0000 | SIO2 | 115.346 | 1.560289 | 1.559505 |
| 50 | −2698.09888 | 15.7215 | HE | 114.878 | .999712 | .999712 |
| 51 | −428.51713 | 35.3166 | SIO2 | 114.769 | 1.560289 | 1.559505 |
| 52 | −229.75028 | .7000 | HE | 116.163 | .999712 | .999712 |
| 53 | 157.14389 | 29.4847 | SIO2 | 100.025 | 1.560289 | 1.559505 |
| 54 | 407.42757 | .7000 | HE | 97.710 | .999712 | .999712 |
| 55 | 135.43900 | 28.6103 | SIO2 | 89.777 | 1.560289 | 1.559505 |
| 56 | 312.12527 | 12.0496 | HE | 82.745 | .999712 | .999712 |
| 57 | 1941.44476 | 12.0000 | SIO2 | 80.391 | 1.560289 | 1.559505 |
| 58 | 299.45406 | .7000 | HE | 70.837 | .999712 | .999712 |
| 59 | 134.94509 | 33.4425 | SIO2 | 64.789 | 1.560289 | 1.559505 |
| 60 | 56.32593 | 1.3033 | HE | 42.057 | .999712 | .999712 |
| 61 | 53.43496 | 33.3158 | CAF2 | 41.245 | 1.501436 | 1.500946 |
| 62 | 353.20173 | 3.0808 | HE | 31.464 | .999712 | .999712 |
| 63 | Infinity | 3.0000 | SIO2 | 29.528 | 1.560289 | 1.559505 |
| 64 | Infinity | 12.0000 | L710 | 27.867 | .999982 | .999982 |
| 65 | Infinity | | | 14.020* | 1.0 | 1.0 |

*This height does not have a limiting effect
L710 is air at 950 mbar
Aspheric constants of the surface 21:
$K = 0,10137327 * 10^{+2}$  $C_1 = 0,40139591 * 10^{-7}$  $C_2 = 0,11813452 * 10^{-12}$
$C_3 = 0,45259406 * 10^{-16}$  $C_4 = -29594696 * 10^{-20}$  $C_5 = 0,11174027 * 10^{-23}$
$C_6 = 0,62923814 * 10^{-28}$ A reduction of the transverse color error by about 30% can be attained by the provision of the lens L11 as calcium fluoride and slight modifications of the lenses of the lens arrangement 19. With an image field of 28.04 mm, the transverse color error is a maximum of ±0.82 nm for $\lambda \pm 0.125$ pm in this variant embodiment, and the longitudinal color error is at most ±57.5 nm. The lens data of the modified variant with two calcium fluoride lenses are given in Table 2.

TABLE 2

| | 193.304 nm m1301a | | | | Refractive indices | |
|---|---|---|---|---|---|---|
| Lens Surface | Radii | Thicknesses | Glasses | Hmax | 193.304 nm | 193.804 nm |
| 1 | Infinity | 14.5311 | L710 | 62.030 | .999982 | .999982 |
| 2 | −168.01710 | 7.0000 | SIO2 | 62.491 | 1.560289 | 1.559505 |
| 3 | 494.67225 | 7.8655 | HE | 68.711 | .999712 | .999712 |
| 4 | 2470.60478 | 17.5906 | SIO2 | 70.967 | 1.560289 | 1.559505 |
| 5 | −238.16599 | .7000 | HE | 72.602 | .999712 | .999712 |
| 6 | 1299.55339 | 17.5821 | SIO2 | 77.012 | 1.560289 | 1.559505 |
| 7 | −301.66419 | .7000 | HE | 77.869 | .999712 | .999712 |
| 8 | 481.31484 | 18.6248 | SIO2 | 79.887 | 1.560289 | 1.559505 |
| 9 | −473.57399 | .7000 | HE | 79.949 | .999712 | .999712 |
| 10 | 266.88043 | 21.7634 | SIO2 | 78.439 | 1.560289 | 1.559505 |
| 11 | −708.35185 | .7000 | HE | 77.528 | .999712 | .999712 |
| 12 | 214.11073 | 26.1927 | SIO2 | 71.854 | 1.560289 | 1.559505 |
| 13 | 100.96743 | 23.5803 | HE | 60.436 | .999712 | .999712 |
| 14 | −1862.02312 | 6.3000 | SIO2 | 60.094 | 1.560289 | 1.559505 |
| 15 | 134.04061 | 23.1274 | HE | 58.551 | .999712 | .999712 |
| 16 | −258.86710 | 6.3000 | SIO2 | 59.015 | 1.560289 | 1.559505 |
| 17 | 209.11797 | 4.1357 | HE | 63.332 | .999712 | .999712 |
| 18 | 260.76414 | 10.0000 | SIO2 | 64.773 | 1.560289 | 1.559505 |
| 19 | 306.31791 | 26.7167 | HE | 66.774 | .999712 | .999712 |
| 20 | −150.53952 | 8.0000 | SIO2 | 68.362 | 1.560289 | 1.559505 |
| 21 | −343.08973A | 12.2234 | HE | 76.639 | .999712 | .999712 |
| 22 | −255.62602 | 14.5522 | CAF2 | 82.065 | 1.501436 | 1.500946 |
| 23 | −155.60089 | .7135 | HE | 84.050 | .999712 | .999712 |
| 24 | 2570.44473 | 36.4559 | SIO2 | 99.015 | 1.560289 | 1.559505 |
| 25 | −197.34110 | .7000 | HE | 101.069 | .999712 | .999712 |
| 26 | 658.21211 | 37.5330 | SIO2 | 106.976 | 1.560289 | 1.559505 |
| 27 | −304.78835 | 12.5228 | HE | 107.346 | .999712 | .999712 |
| 28 | 165.31624 | 40.9031 | SIO2 | 97.479 | 1.560289 | 1.559505 |
| 29 | −4380.57486 | 4.7796 | HE | 94.694 | .999712 | .999712 |
| 30 | 229.18415 | 15.0000 | SIO2 | 81.886 | 1.560289 | 1.559505 |

TABLE 2-continued

| | 193.304 nm m1301a | | | | Refractive indices | |
|---|---|---|---|---|---|---|
| Lens Surface | Radii | Thicknesses | Glasses | Hmax | 193.304 nm | 193.804 nm |
| 31 | 127.94022 | 29.9427 | HE | 70.764 | .999712 | .999712 |
| 32 | −406.54392 | 6.3000 | SIO2 | 69.593 | 1.560289 | 1.559505 |
| 33 | 319.24233 | 21.1149 | HE | 65.789 | .999712 | .999712 |
| 34 | −194.65176 | 6.3000 | SIO2 | 65.210 | 1.560289 | 1.559505 |
| 35 | 181.88877 | 36.3561 | HE | 65.538 | .999712 | .999712 |
| 36 | −117.18877 | 6.3000 | SIO2 | 66.424 | 1.560289 | 1.559505 |
| 37 | 1557.90278 | 19.4997 | HE | 77.908 | .999712 | .999712 |
| 38 | 219.93598 | 13.5189 | SIO2 | 79.860 | 1.560289 | 1.559505 |
| 39 | −188.67644 | .7000 | HE | 84.977 | .999712 | .999712 |
| 40 | −1338.43234 | 33.3397 | SIO2 | 96.879 | 1.560289 | 1.559505 |
| 41 | −203.66807 | .7000 | HE | 101.108 | .999712 | .999712 |
| 42 | 940.74664 | 37.9766 | SIO2 | 113.017 | 1.560289 | 1.559505 |
| 43 | −328.34415 | .0000 | HE | 114.751 | .999712 | .999712 |
| 44 | Infinity | 7.0063 | HE | 115.860 | .999712 | .999712 |
| | Diaphragm | .0000 | | 115.860 | | |
| 45 | 852.93737 | 33.9995 | SIO2 | 119.015 | 1.560289 | 1.559505 |
| 46 | −429.06783 | .7000 | HE | 119.681 | .999712 | .999712 |
| 47 | 293.26753 | 39.6485 | SIO2 | 117.910 | 1.560289 | 1.559505 |
| 48 | −1122.40839 | 25.1587 | HE | 116.310 | .999712 | .999712 |
| 49 | −250.45086 | 12.0000 | SIO2 | 115.174 | 1.560289 | 1.559505 |
| 50 | −2403.16353 | 15.7564 | HE | 114.736 | .999712 | .999712 |
| 51 | −418.77311 | 35.6541 | SIO2 | 114.623 | 1.560289 | 1.559505 |
| 52 | −229.51380 | .7000 | HE | 116.090 | .999712 | .999712 |
| 53 | 157.59158 | 29.5131 | SIO2 | 100.117 | 1.560289 | 1.559505 |
| 54 | 411.55925 | .7000 | HE | 97.819 | .999712 | .999712 |
| 55 | 135.23398 | 26.6934 | SIO2 | 86.824 | 1.560289 | 1.559505 |
| 56 | 312.28548 | 12.0796 | HE | 82.801 | .999712 | .999712 |
| 57 | 1974.55831 | 12.0000 | SIO2 | 80.455 | 1.560289 | 1.559505 |
| 58 | 304.24095 | .7000 | HE | 70.960 | .999712 | .999712 |
| 59 | 135.28036 | 33.4905 | SIO2 | 64.839 | 1.560289 | 1.559505 |
| 60 | 56.37313 | 1.2983 | HE | 42.062 | .999712 | .999712 |
| 61 | 53.46309 | 33.2706 | CAF2 | 41.247 | 1.501436 | 1.500946 |
| 62 | 351.07410 | 3.0893 | HE | 31.472 | .999712 | .999712 |
| 63 | Infinity | 3.0000 | SIO2 | 29.536 | 1.560289 | 1.559505 |
| 64 | Infinity | 12.0000 | L710 | 27.875 | .999982 | .999982 |
| 65 | Infinity | | | 14.020* | 1.0 | 1.0 |

*This height does not have a limiting effect
L710 is air at 950 mbar
Aspheric constants of the surface 21:
K = −0, 10137327 * $10^{+2}$  $C_1$ = 0, 40139591 * $10^{−07}$  $C_2$ = 0, 11813452 * $10^{−12}$
$C_3$ = 0, 45259406 * $10^{−16}$  $C_4$ = −0, 29594696 * $10^{−20}$  $C_5$ = 0, 11174027 * $10^{−23}$
$C_6$ = −0, 62923814 * $10^{−28}$ The lens arrangement 19 shown in FIG. 3 has 31 lenses, L1–L31, which can be divided into six lens groups LG1–LG6. The distance between the object plane 0 and the image plane 0' is 1,000 mm.

The first lens group has positive refractive power and consists of the lenses L1–L5. The first lens L1 is a biconcave lens and has negative refractive power. The lenses L2–L5 following it are biconvex lenses which have positive refractive power.

The second lens group LG2 consists of the lenses L6–L10, the lenses L6–L8 having negative refractive power. The lens L9 has positive refractive power. This lens L9 is again a meniscus lens with a concave curved surface on the image side. Lens L10 has negative refractive power and is provided with an aspheric lens surface on the image side. This lens surface in particular permits higher order image errors to be corrected.

The adjoining lens group LG3 has positive refractive power. A bulge is formed by this lens group with the lenses L11–L14. The lens L14 is provided with a plane surface on the image side. The arrangement of the lens group L3 has the distinctive feature that unusually large air distances are provided on both sides, between lens group LG3 and the lens groups LG2 and LG4 bordering on it. By the special arrangement of the third lens group, the deviation of the wavefront could be reduced over all image heights, in this doubly telecentric objective having a high numerical aperture of 0.75, with little use of aspherics and a constructional length of 00'=1,000 mm. The sum of the two air spaces before and after LG3 is markedly greater than the sum of the glass thicknesses of the following lens group LG4. This has a particularly advantageous effect on the transverse aberrations.

The fourth lens group, by which a second waist is formed, consists of the lenses L15–L18. The lens L15 is curved toward the object. The lens L19, of the adjoining lens group LG5, has lens surfaces which run nearly parallel and are curved toward the image. The difference of the radii is smaller than 3% with respect to the smaller radius. In particular, the absolute difference of radii is smaller than 4 mm. The refractive power of this lens L19 is very small, with $f_{19}$>4,000.

The lens group LG5 includes the further lenses L20–L27, a diaphragm being arranged between the lenses L21 and L22. The last lens group, LG6, is formed by the lenses L28–L31, L31 being a plane parallel plate.

Figure 3:
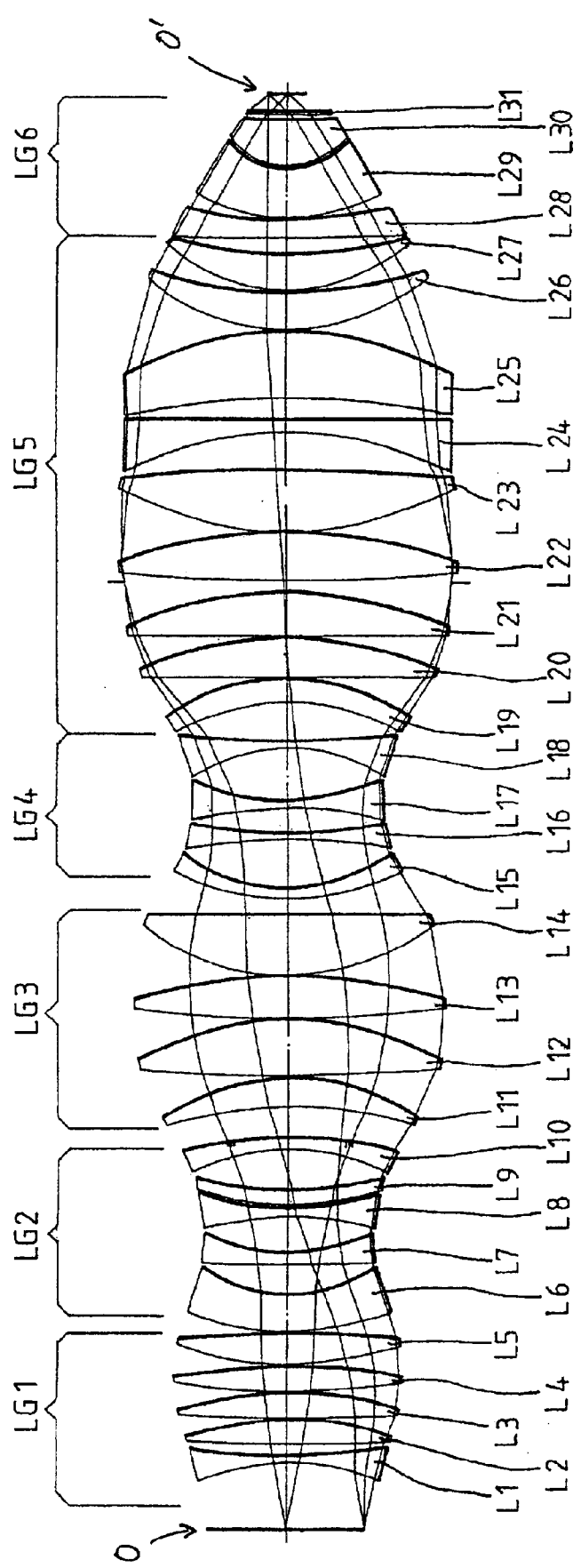
FIG. 3 shows a lithographic objective, particularly for the wavelength 193 nm.

This lens arrangement 19 shown in FIG. 3 is designed for the wavelength 193 nm. The bandwidth of the light source is 0.25 pm. A field of 10.5×26 mm can be exposed by means of this lens arrangement 19. The numerical aperture of this lens arrangement is 0.75 on the image side. The RMS value, as a deviation from the ideal spherical wave, is monochromatically smaller than 5 mλ with respect to 193 nm. The transverse color error is smaller than ±1.4 nm for Δλ±0.125 pm, and the longitudinal color error is smaller than ±58.75 nm in the whole image field.

The exact lens data are given in Table 3.

TABLE 3

| M1650p Lens Surface | Radii | Thicknesses | Glasses | Refractive index at 193.304 nm | ½ Free Diameter |
|---|---|---|---|---|---|
| 0 | 0.000000000 | 45.969574340 | L710 | 0.99998200 | 56.080 |
| 1 | −163.893583594 | 7.000000000 | SIO2 | 1.56028895 | 62.298 |
| 2 | 543.276868900 | 6.914746504 | HE | 0.99971200 | 68.527 |
| 3 | 4925.150504439 | 17.003634307 | SIO2 | 1.56028895 | 70.200 |
| 4 | −237.663812578 | 0.700000000 | HE | 0.99971200 | 71.892 |
| 5 | 1399.349047982 | 18.279497082 | SIO2 | 1.56028895 | 76.260 |
| 6 | −282.822296960 | 0.700000001 | HE | 0.99971200 | 77.210 |
| 7 | 485.041831962 | 19.095677657 | SIO2 | 1.56028895 | 79.259 |
| 8 | −448.790019973 | 0.700000000 | HE | 0.99971200 | 79.327 |
| 9 | 261.052873524 | 21.940801476 | SIO2 | 1.56028895 | 77.716 |
| 10 | −776.403478410 | 0.700000000 | HE | 0.99971200 | 76.687 |
| 11 | 210.308913355 | 25.735549153 | SIO2 | 1.56028895 | 71.175 |
| 12 | 99.341848189 | 22.473973608 | HE | 0.99971200 | 59.883 |
| 13 | 0.000000000 | 8.009409065 | SIO2 | 1.56028895 | 59.565 |
| 14 | 130.189257019 | 24.765647204 | HE | 0.99971200 | 57.743 |
| 15 | −236.044200760 | 7.570027862 | SIO2 | 1.56028895 | 58.334 |
| 16 | 225.745307153 | 1.721089583 | HE | 0.99971200 | 62.796 |
| 17 | 249.257978944 | 10.000000000 | SIO2 | 1.56028895 | 63.335 |
| 18 | 290.876194298 | 26.689502502 | HE | 0.99971200 | 65.179 |
| 19 | −157.850195148 | 8.000000000 | SIO2 | 1.56028895 | 67.322 |
| 20 | −343.089730000A | 21.241706809 | HE | 0.99971200 | 74.633 |
| 21 | −300.686931187 | 19.035466008 | SIO2 | 1.56028895 | 85.971 |
| 22 | −166.339801171 | 1.155814165 | HE | 0.99971200 | 88.981 |
| 23 | 1242.960741027 | 39.709671515 | SIO2 | 1.56028895 | 103.381 |
| 24 | −217.561562194 | 0.700000000 | HE | 0.99971200 | 105.365 |
| 25 | 873.041438293 | 28.702760134 | SIO2 | 1.56028895 | 108.135 |
| 26 | −394.309651697 | 0.700000002 | HE | 0.99971200 | 108.176 |
| 27 | 168.490233663 | 42.038473874 | SIO2 | 1.56028895 | 100.522 |
| 28 | 0.000000000 | 13.298461584 | HE | 0.99971200 | 97.459 |
| 29 | 198.769354524 | 7.491654073 | SIO2 | 1.56028895 | 79.508 |
| 30 | 127.110375082 | 32.181225955 | HE | 0.99971200 | 72.267 |
| 31 | −412.500785204 | 6.000000000 | SIO2 | 1.56028895 | 70.633 |
| 32 | 396.017439811 | 16.248991558 | HE | 0.99971200 | 67.019 |
| 33 | −267.221433894 | 6.000000000 | SIO2 | 1.56028895 | 66.551 |
| 34 | 168.512314408 | 36.354622161 | HE | 0.99971200 | 65.389 |
| 35 | −122.758597736 | 6.049883829 | SIO2 | 1.56028895 | 66.079 |
| 36 | 766.523644100 | 27.033401060 | HE | 0.99971200 | 75.781 |
| 37 | −159.522000000 | 16.394944690 | SIO2 | 1.56028895 | 77.809 |
| 38 | −155.641000000 | 0.700000000 | HE | 0.99971200 | 84.996 |
| 39 | 0.000000000 | 27.995555874 | SIO2 | 1.56028895 | 101.051 |
| 40 | −266.016738680 | 0.890470375 | HE | 0.99971200 | 103.561 |
| 41 | 0.000000000 | 30.098513441 | SIO2 | 1.56028895 | 110.668 |
| 42 | −290.836485170 | 7.000000010 | HE | 0.99971200 | 112.215 |
| 43 | 0.000000000 | 0.431524267 | HE | 0.99971200 | 115.718 |
| 44 | 1323.425726038 | 33.775984345 | SIO2 | 1.56028895 | 119.885 |
| 45 | −354.247417821 | 0.700000000 | HE | 0.99971200 | 120.693 |
| 46 | 253.851238303 | 43.981502597 | SIO2 | 1.56028895 | 119.436 |
| 47 | −1091.287744312 | 24.113176044 | HE | 0.99971200 | 117.882 |
| 48 | −256.378455601 | 10.108953957 | SIO2 | 1.56028895 | 116.975 |
| 49 | 510547.419151742 | 13.749960972 | HE | 0.99971200 | 115.781 |
| 50 | −549.718956763 | 46.950737825 | SIO2 | 1.56028895 | 115.712 |
| 51 | −237.550046531 | 0.733009323 | HE | 0.99971200 | 117.030 |
| 52 | 152.354106326 | 27.736146606 | SIO2 | 1.56028895 | 98.476 |
| 53 | 340.293718782 | 0.709804301 | HE | 0.99971200 | 95.981 |
| 54 | 131.460836161 | 25.026141744 | SIO2 | 1.56028895 | 85.578 |
| 55 | 293.107264484 | 10.404798830 | HE | 0.99971200 | 82.205 |
| 56 | 1251.239137872 | 12.817811407 | SIO2 | 1.56028895 | 81.001 |
| 57 | 260.342262866 | 1.378798137 | HE | 0.99971200 | 70.436 |
| 58 | 130.810580199 | 34.683194416 | SIO2 | 1.56028895 | 64.390 |
| 59 | 55.085948639 | 0.700000000 | HE | 0.99971200 | 41.181 |
| 60 | 52.721068002 | 33.140446950 | CAF2 | 1.50143563 | 40.631 |
| 61 | 357.005545933 | 2.868260812 | HE | 0.99971200 | 30.936 |

TABLE 3-continued

| M1650p Lens Surface | Radii | Thicknesses | Glasses | Refractive index at 193.304 nm | ½ Free Diameter |
|---|---|---|---|---|---|
| 62 | 0.000000000 | 3.000000000 | SIO2 | 1.56028895 | 29.212 |
| 63 | 0.000000000 | 12.000000000 | L710 | 0.99998200 | 27.572 |
| 64 | 0.000000000 | 0.000000000 | | 1.00000000 | 14.020 |

L710 is air at 950 mbar
Aspheric constants of the surface 20:
K    10.1373
C1   4.01395910e − 008
C2   1.18134520e − 013
C3   4.52594060e − 017
C4   −2.95946970e − 021
C5   1.11740260e − 024
C6   −6.29238120e − 029
C7   0.00000000e + 000
C8   0.00000000e + 000
C9   0.00000000e + 000
Zernicke portion of the aspheric surface No. 21
ZER9 = 227.260 μm
ZER16 = 6.79061 μm
ZER25 = 1.17273 μm
ZER36 = 0.100691 μm
ZER49 = −0.00116301 μm
related to a half free diameter of 74.633 mm $$P(h) = \frac{\delta \cdot h \cdot h}{1 + \sqrt{1 - (1+K) \cdot \delta \cdot \delta \cdot h \cdot h}} + C_1 h^4 + \ldots + C_n h^{2n+2}$$

$$\delta = 1/R$$

where P is the sagitta as a function of the radius h (height to the optical axis 7), with the aspheric constants $C_1$ through $C_n$ given in the Tables. R is the vertex radius given in the Tables.

TABLE 4

| M1440a Lens | Radii | Thicknesses | Glasses | ½ Lens Diameter | Refractive index at 351.1 nm |
|---|---|---|---|---|---|
| L 0 | Infinity | 35.0240 | L710 | 60.887 | .999982 |
| L 1 | −908.93348 | 7.0000 | FK5 | 61.083 | 1.506235 |
| | 284.32550 | 6.4165 | L710 | 63.625 | .999982 |
| L 2 | 968.84099 | 23.7611 | FK5 | 64.139 | 1.506235 |
| | −212.21935 | .7000 | L710 | 66.550 | .999982 |
| L 3 | 413.73094 | 17.2081 | FK5 | 69.428 | 1.506235 |
| | −424.88479 | 18.8724 | L710 | 69.711 | .999982 |
| L 4 | 591.81336 | 19.7102 | FK5 | 69.490 | 1.506235 |
| | −250.67222 | .7000 | L710 | 69.228 | .999982 |
| L 5 | −2772.23751 | 12.8582 | FK5 | 67.060 | 1.506235 |
| | −255.60433 | .7000 | L710 | 66.381 | .999982 |
| L 6 | 4699.63023 | 9.0382 | FK5 | 62.603 | 1.506235 |
| | 120.65688 | 26.0302 | L710 | 56.905 | .999982 |
| L 7 | −182.28783 | 6.0000 | FK5 | 56.589 | 1.506235 |
| | 302.39827 | 20.1533 | L710 | 57.318 | .999982 |
| L 8 | −140.55154 | 6.0000 | FK5 | 57.674 | 1.506235 |
| | 205.78996 | .7000 | L710 | 64.913 | .999982 |
| L 9 | 197.09815 | 10.0000 | FK5 | 66.049 | 1.506235 |
| | 223.79756 | 27.0961 | L710 | 68.261 | .999982 |
| L 10 | −191.72586 | 8.0000 | FK5 | 70.299 | 1.506235 |
| | −343.08973A | 2.2458 | L710 | 77.287 | .999982 |
| L 11 | −292.95078 | 19.3593 | FK5 | 77.813 | 1.506235 |
| | −143.32621 | .7000 | L710 | 80.683 | .999982 |
| L 12 | 1440.49435 | 47.0689 | FK5 | 95.650 | 1.506235 |
| | −155.30867 | .7000 | L710 | 98.253 | .999982 |
| L 13 | −2647.76343 | 13.8320 | FK5 | 100.272 | 1.506235 |
| | −483.82832 | .7000 | L710 | 100.543 | .999982 |
| L 14 | 169.62760 | 45.9417 | FK5 | 99.308 | 1.506235 |
| | −1090.68864 | 3.2649 | L710 | 96.950 | .999982 |
| L 15 | 102.07790 | 10.0000 | FK5 | 77.455 | 1.505235 |
| | 100.38160 | 40.1873 | L710 | 73.370 | .999982 |
| L 16 | −504.79995 | 6.0000 | FK5 | 71.843 | 1.506235 |
| | 130.61081 | 34.6867 | L710 | 64.992 | .999922 |
| L 17 | −153.51955 | 6.0000 | FK5 | 64.734 | 1.506235 |
| | 284.44035 | 34.2788 | L710 | 67.573 | .999982 |

TABLE 4-continued

| M1440a Lens | Radii | Thicknesses | Glasses | ½ Lens Diameter | Refractive index at 351.1 nm |
|---|---|---|---|---|---|
| L 18 | −114.12583 | 8.2925 | FK5 | 68.531 | 1.506235 |
|  | 731.33965 | 20.4412 | L710 | 84.132 | .999982 |
| L 19 | −291.19603 | 24.2439 | FK5 | 86.387 | 1.506235 |
|  | −173.68634 | .7000 | L710 | 93.185 | .999982 |
| L 20 | −10453.06716 | 28.2387 | FK5 | 111.655 | 1.506235 |
|  | −304.21017 | .7000 | L710 | 114.315 | .999982 |
| L 21 | −2954.65846 | 30.7877 | FK5 | 122.647 | 1.506235 |
|  | −312.03660 | 7.0000 | L710 | 124.667 | .999982 |
| Diaphragm | Infinity | .0000 |  | 131.182 | .999982 |
| L 22 | 1325.30512 | 52.2352 | FK5 | 133.384 | 1.506235 |
|  | −282.76663 | .7000 | L710 | 135.295 | .999982 |
| L 23 | 276.96510 | 52.6385 | FK5 | 134.809 | 1.506235 |
|  | −1179.05517 | 25.2703 | L710 | 132.935 | .999982 |
| L 24 | −311.05526 | 10.0000 | FK5 | 131.670 | 1.506235 |
|  | −587.25843 | 10.5026 | L710 | 130.474 | .999982 |
| L 25 | −374.19522 | 15.0000 | FK5 | 130.116 | 1.506235 |
|  | −293.45628 | .7000 | L710 | 130.127 | .999982 |
| L 26 | 198.19004 | 29.6167 | FK5 | 111.971 | 1.506235 |
|  | 535.50347 | .7000 | L710 | 109.450 | .999982 |
| L 27 | 132.82366 | 34.0368 | FK5 | 94.581 | 1.506235 |
|  | 361.69797 | 12.8838 | L710 | 90.620 | .999982 |
| L 28 | 7006.77771 | 9.7505 | FK5 | 88.792 | 1.506235 |
|  | 349.77435 | 1.0142 | L710 | 79.218 | .999982 |
| L 29 | 174.38688 | 38.8434 | FK5 | 73.443 | 1.506235 |
|  | 55.37159 | 4.9107 | L710 | 45.042 | .999982 |
| L 30 | 55.08813 | 42.8799 | FK5 | 43.842 | 1.506235 |
|  | 807.41351 | 1.9795 | L710 | 30.725 | .999982 |
|  | Infinity | 3.0000 | FK5 | 29.123 | 1.506235 |
|  | Infinity | 12.0000 |  | 27.388 | .999982 |

Figure 4:
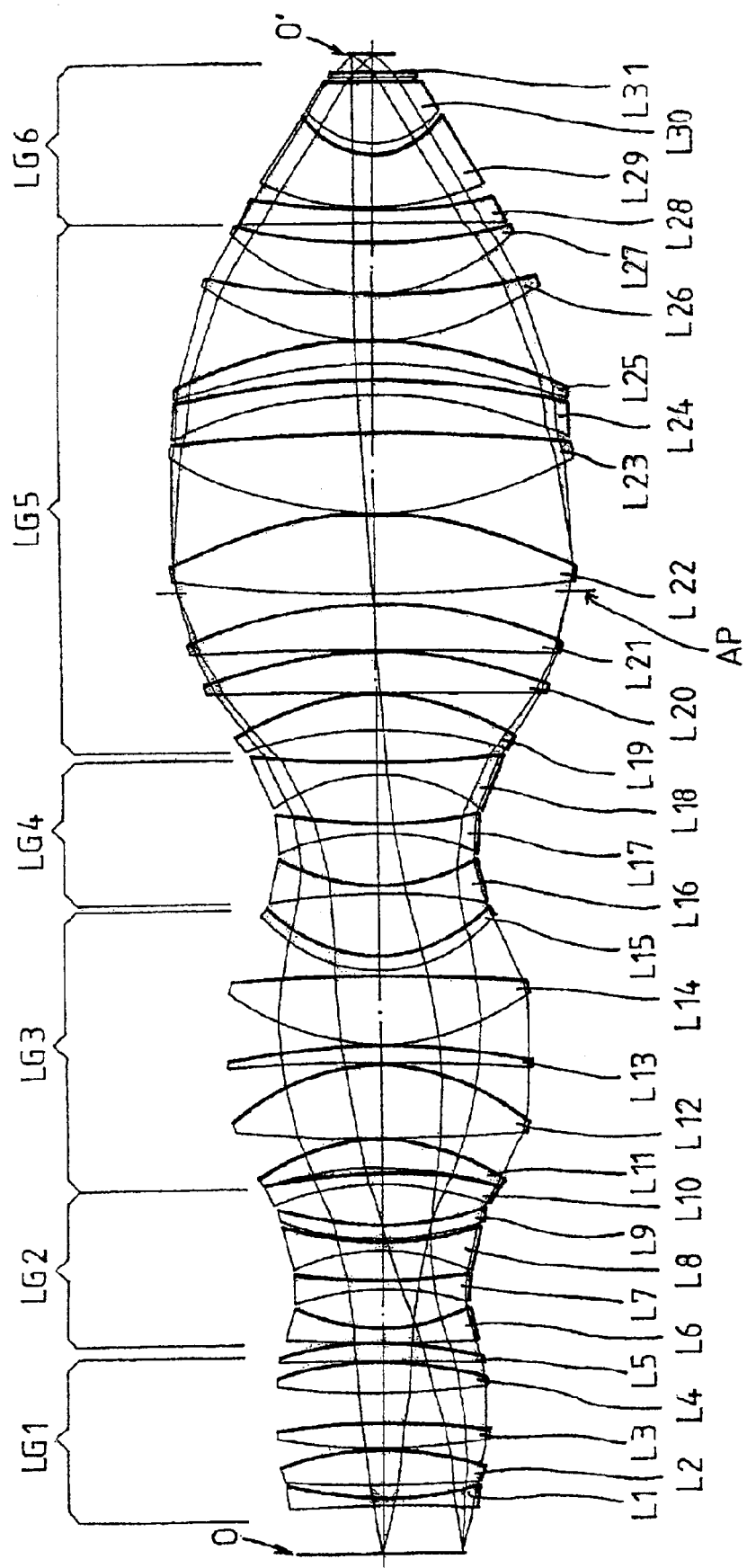
FIG. 4 shows a lithographic objective, particularly for an illumination wavelength of 351 nm.

L710 is air at 950 mbar
ASPHERIC CONSTANTS of the image-side lens surface of the lens L10:
K = −0, 10137327 × $10^2$
$C_1$ = 0, 40139591 × $10^{-7}$
$C_2$ = 0, 011813452 × $10^{-12}$
$C_3$ = 0, 45259406 × $10^{-16}$
$C_4$ = 0, 29594697 × $10^{-20}$
$C_5$ = 0, 11174026 × $10^{-23}$
$C_6$ = −0, 62923812 × $10^{-28}$ A lens arrangement 19 is shown in FIG. 5 with an image-side aperture of 0.7; it can be divided into six lens groups and consists only of spherical lenses. This embodiment example, in contrast to FIG. 4, has an extremely long first lens group, which comprises the lenses L1–L5. This elongate bulge is substantially formed by the thick positive lenses L4 and L5. A small distortion is attained with only spherical lenses by means of this first, elongate bulge, a worse input telecentricity being accepted, which is due to the shape of this first bulge, and which can be compensated for by the illumination system. This first lens group has positive refractive power.

The second lens group L2 includes four negative lenses, a positive meniscus lens L9 which is curved toward the object again being arranged between the third negative lens L8 and the fourth negative lens L10. No aspheric lens surface is provided in this embodiment example. Astigmatism, coma and sagittal coma can in particular be corrected by means of this configuration of the first lens group LG2 with negative refractive power.

The third lens group comprises the lenses L11–L15 and has positive refractive power. In this embodiment example, in contrast to the first embodiment example, the lenses L12 and L14 are not so strongly pronounced. This third lens group has in particular a positive effect on the imaging quality in the quadrants.

The fourth lens group LG4 is formed, in spite of the high aperture of 0.70, by only three negative lenses, and thus has negative refractive power.

The adjoining fifth lens group LG5, which has positive refractive power, begins with the three positive lenses L19–L21, behind which the diaphragm is arranged. Behind the diaphragm are again arranged two thick positive lenses L22 and L23 which are constituted with strongly curved mutually facing lens surfaces. The focal lengths are $f_{12}$= 486.1 and $f_{34}$=431.429. The adjoining lenses L24 and L25 are provided for the correction of the oblique spherical aberration in the sagittal and tangential directions.

The sixth lens group comprises the lenses L28–L31 and has positive refractive power.

This objective has a numerical aperture of 0.7 at a wavelength of λ=351.4 nm The length from the image plane 0 to the object plane 0' is 1,000 mm, an image field of 8×26 mm being illuminated. All the lenses are made of crown glass, e.g., FK 5 of the SCHOTT Company. The objective requires laser light with a half value width of about 4.3 pm for the imaging of structures 210 nm wide, with a diagonal image field diameter of 27.20 mm. For a Δλ of ±2.15 pm, the longitudinal color error is ±140 nm, and the transverse color error is at most 2.4 nm.

The exact lens data are given in Table 5.

TABLE 5

| M1439a Lens | Radii | Thicknesses | Glasses | ½ Lens Diameter | Refractive index at 351.1 nm |
|---|---|---|---|---|---|
| 0 | Infinity | 37.4632 | L710 | 60.122 | .999982 |
| L1 | −765.87757 | 6.1000 | FK5 | 60.667 | 1.506235 |
|  | 189.10818 | 15.0560 | L710 | 63.489 | .999982 |

TABLE 5-continued

| M1439a Lens | Radii | Thicknesses | Glasses | ½ Lens Diameter | Refractive index at 351.1 nm |
|---|---|---|---|---|---|
| L2 | −1924.23712 | 14.8631 | FK5 | 64.889 | 1.506235 |
|  | −210.10849 | .7000 | L710 | 66.477 | .999982 |
| L3 | −1771.07074 | 12.9447 | FK5 | 69.458 | 1.506235 |
|  | −265.44452 | .7944 | L710 | 70.441 | .999982 |
| L4 | 4429.34036 | 57.0511 | FK5 | 72.296 | 1.506235 |
|  | −157.99293 | 10.8676 | L710 | 76.220 | .999982 |
| L5 | 1697.66973 | 44.3818 | FK5 | 72.396 | 1.506235 |
|  | −160.27202 | 3.1174 | L710 | 69.891 | .999982 |
| L6 | −270.20389 | 6.1000 | FK5 | 64.496 | 1.506235 |
|  | 145.59587 | 23.8094 | L710 | 59.327 | .999982 |
| L7 | −216.22267 | 6.1000 | FK5 | 59.111 | 1.506235 |
|  | 264.18566 | 22.2709 | L710 | 60.114 | .999982 |
| L8 | −154.67894 | 6.1000 | FK5 | 60.693 | 1.506235 |
|  | 682.06879 | .7398 | L710 | 66.605 | .999982 |
| L9 | 613.14630 | 9.9262 | FK5 | 67.195 | 1.506235 |
|  | 5830.30332 | 11.7064 | L710 | 68.965 | .999982 |
| L10 | −302.46010 | 6.1037 | FK5 | 70.262 | 1.506235 |
|  | −1240.99707 | 11.3919 | L710 | 74.655 | .999982 |
| L11 | −304.61263 | 14.0742 | FK5 | 76.744 | 1.506235 |
|  | −173.33791 | .7386 | L710 | 78.915 | .999982 |
| L12 | −18363.19083 | 29.3863 | FK5 | 86.930 | 1.506235 |
|  | −186.22288 | .7000 | L710 | 88.783 | .999982 |
| L13 | 1172.01143 | 16.5023 | FK5 | 92.295 | 1.506235 |
|  | −590.45415 | .7000 | L710 | 92.625 | .999982 |
| L14 | 157.32134 | 37.1074 | FK5 | 92.978 | 1.506235 |
|  | 6181.16889 | .7000 | L710 | 91.301 | .999982 |
| L15 | 146.43371 | 14.3174 | FK5 | 82.500 | 1.506235 |
|  | 202.92507 | 50.3624 | L710 | 80.095 | .999982 |
| L16 | −572.56205 | 6.1000 | FK5 | 66.246 | 1.506235 |
|  | 121.14512 | 30.5565 | L710 | 59.998 | .999982 |
| L17 | −157.40409 | 6.1000 | FK5 | 59.747 | 1.506235 |
|  | 256.95256 | 32.8427 | L710 | 61.781 | .999982 |
| L18 | −98.80342 | 7.8212 | FK5 | 62.557 | 1.506235 |
|  | 641.39965 | 18.1478 | L710 | 77.492 | .999982 |
| L19 | −308.76412 | 25.1716 | FK5 | 80.101 | 1.506235 |
|  | −160.15183 | .7198 | L710 | 86.681 | .999982 |
| L20 | −1043.39436 | 24.1973 | FK5 | 100.363 | 1.506235 |
|  | −240.97724 | .7732 | L710 | 102.908 | .999982 |
| L21 | 1125.18771 | 28.8421 | FK5 | 114.949 | 1.506235 |
|  | −430.47634 | 5.0000 | L710 | 116.447 | .999982 |
|  | Infinity | 2.0000 | L710 | 120.343 | .999982 |
|  | Diaphragm | .0000 |  | 120.343 |  |
| L22 | −3902.89359 | 42.5513 | FK5 | 120.388 | 1.506235 |
|  | −230.34901 | .7000 | L710 | 122.380 | .999982 |
| L23 | 245.03767 | 46.6321 | FK5 | 123.915 | 1.506235 |
|  | −1881.85244 | 29.1602 | L710 | 122.327 | .999982 |
| L24 | −267.61242 | 10.0000 | FK5 | 121.023 | 1.506235 |
|  | −375.94475 | 6.6966 | L710 | 120.815 | .999982 |
| L25 | −319.48578 | 12.2841 | FK5 | 120.185 | 1.506235 |
|  | −264.83170 | .7000 | L710 | 120.270 | .999982 |
| L26 | 212.78046 | 21.2016 | FK5 | 105.054 | 1.506235 |
|  | 451.72928 | .7000 | L710 | 103.107 | .999982 |
| L27 | 124.48521 | 34.0506 | FK5 | 90.946 | 1.506235 |
|  | 347.71817 | 14.6164 | L710 | 87.431 | .999982 |
| L28 | −10967.28804 | 15.6165 | FK5 | 84.762 | 1.506235 |
|  | 347.69074 | .7000 | L710 | 73.470 | .999982 |
| L29 | 175.92874 | 41.2004 | FK5 | 69.063 | 1.506235 |
|  | 53.54834 | 4.2189 | L710 | 42.333 | .999982 |
| L30 | 53.63724 | 40.1656 | FK5 | 41.450 | 1.506235 |
|  | 1252.66340 | 3.3571 | L710 | 30.075 | .999982 |
| L31 | Infinity | 3.0000 | FK5 | 27.101 | 1.506235 |
|  | Infinity | 12.0000 | L710 | 25.514 | .999982 |
|  | Infinity |  |  | 13.603* | 1.0 |

L710 is air at 950 mbar

I claim:

1. A double telecentric projection objective comprising an image side numerical aperture of at least 0.7 and a lens group in which a diaphragm is arranged, wherein lenses arranged before the diaphragm on a side facing toward a reticle have exclusively positive refractive power, a first lens of these lenses of positive refractive power having a positive focal length between 4 and 25 times a value of an object-to-image distance.

2. The double telecentric projection objective according to claim 1, wherein a first lens of lenses of positive refractive power has a difference of radii that is smaller than 4% of an object-to-image distance.

3. A projection exposure device for microlithography, comprising a projection objective comprising a lens arrangement according to claim 1.

4. A process for the manufacture of microstructured components, comprising the steps of
exposing a substrate provided a photosensitive layer by means of ultraviolet laser light by means of a mask and a projection exposure device with a lens arrangement according to claim 1, and
structuring the substrate corresponding to a pattern contained on the mask, if necessary after development of the photosensitive layer.

5. The projection objective according to claim 1, comprising a lens arrangement comprising at least one lens group of negative refractive power including at least four lenses of negative refractive power,
wherein a meniscus lens of positive refractive power is arranged in the at least one lens group of negative refractive power after a third lens of negative refractive power.

6. A double telecentric projection objective according to claim 1, comprising a first lens group of positive refractive power, a second lens group of negative refractive power, a third lens group of positive refractive power, and a fourth lens group of negative refractive power, wherein a respective air interspace is arranged between the second and the third lens groups, and the third and the fourth lens groups, a sum of these air spaces exceeding a sum of a lens thicknesses of the fourth lens group by at least 30%, said lens groups each comprising a plurality of lenses, the objective being arranged to be a double telecentric lithographic reduction objective.

7. A double telecentric projection objective, comprising a first lens group of positive refractive power, a second lens group of negative refractive power, a third lens group of positive refractive power, and a fourth lens group of negative refractive power, wherein a respective air interspace is arranged between the second and the third lens groups, and the third and the fourth lens groups, a sum of these air spaces exceeding a sum of a lens thicknesses of the fourth lens group by at least 30%, said lens groups each comprising a plurality of lenses, the objective being arranged to be a double telecentric lithographic reduction objective.

8. The double telecentric objective according to claim 7, wherein the air interspace between the third and the fourth lens group comprises an extent in an axial direction that attains a value of at least 50% of a sum of glass thicknesses of the fourth lens group.

9. The double telecentric objective according to claim 7, wherein the air interspace between the third and the fourth lens group has an extent in an axial direction that attains a value of at least 60% of an extent of the air interspace between a second and the third lens group.

10. A projection objective comprising a lens arrangement comprising at least one lens group of negative refractive power, said at least one lens group of negative refractive power including at least four lenses of negative refractive power,
wherein a meniscus lens of positive refractive power is arranged in this lens group after a third lens of negative refractive power,
comprising a first lens group of positive refractive power, a second lens group of negative refractive power, a third lens group of positive refractive power, and a fourth lens group of negative refractive power, wherein a respective air interspace is arranged between the second and the third lens groups, and the third and the fourth lens groups, a sum of these air spaces exceeding a sum of a lens thicknesses of the fourth lens group by at least 30%, said lens groups each comprising a plurality of lenses, the objective being arranged to be a double telecentric lithographic reduction objective.

11. A projection objective comprising a lens arrangement with at least one lens group of negative refractive power, said at least one lens group consisting in sequence from an object side to an image side of said objective of, at least three lenses of negative refractive power, exactly one lens of positive refractive power, and at least one lens of negative refractive power, said lens of positive refractive power being a meniscus lens.

12. The projection objective according to claim 11, wherein the projection objective comprises at least a second lens group of negative refractive power.

13. The projection objective according to claim 11, wherein the lens of positive refractive power is arranged in a first lens group of negative refractive power.

14. A projection exposure device for microlithography, comprising a projection objective comprising a lens arrangement according to claim 11.

15. A process for the manufacture of microstructured components, comprising the steps of exposing a substrate provided a photosensitive layer by means of ultraviolet laser light by means of a mask and a projection exposure device with a lens arrangement according to claim 11, and structuring the substrate corresponding to a pattern contained on the mask, if necessary after development of the photosensitive layer.

16. The projection objective according to claim 11, wherein the meniscus lens of positive refractive power arranged in the lens group of negative refractive power comprises an object side convex lens surface.

17. A projection objective comprising a lens arrangement comprising a first lens group of negative refractive power, said first lens group including at least four lenses of negative refractive power, wherein a meniscus lens with positive refractive power with an object side convex lens surface is arranged in said first lens group after and adjacent to a third lens of negative refractive power.

18. The projection objective according to claim 17, wherein the projection objective comprises at least a second lens group of negative refractive power.

19. A projection exposure device for microlithography, comprising projection objective comprising a lens arrangement according to claim 17.

20. A process for the manufacture of microstructured components, comprising the steps of exposing a substrate provided a photosensitive layer by means of ultraviolet laser light by means of a mask and a projection exposure device with a lens arrangement according to claim 17, and structuring the substrate corresponding to a pattern contained on the mask, if necessary after development of the photosensitive layer.

* * * * *